June 9, 1959 L. R. JACOBSEN 2,890,291

LINEAR HIGH-GAIN AMPLIFIER CIRCUITS OR THE LIKE

Filed Jan. 27, 1955

INVENTOR.
LANCE R. JACOBSEN
BY Bruce [signature]
HIS ATTORNEY

United States Patent Office 2,890,291

Patented June 9, 1959

2,890,291

LINEAR HIGH-GAIN AMPLIFIER CIRCUITS OR THE LIKE

Lance R. Jacobsen, Lynwood, Calif., assignor to Hoffman Electronics Corporation, a corporation of California Application January 27, 1955, Serial No. 484,506

3 Claims. (Cl. 179—171)

This invention is related to amplifier circuits and, more particularly, to an improved amplifier which will exhibit a uniform frequency response characteristic from one cycle per second to radio frequencies, which will employ a minimum number of components, and which will exhibit gain of the order of the amplification factor of the particular tube in use.

In the past, notable achievements have been made in the electronics art in developing constantly improved amplifiers of one form or another, but the search for the ideal amplifier still continues. It is well known that there are many defects in amplifiers presently being employed in the electronics industry. A few of these defects are: limited gain per stage (for a given bandwidth), a dropping off of the frequency response characteristic at the high end of the frequency range, and the requirement of a large number of circuit components to preserve linearity. To the knowledge of the applicant, no amplifier circuit has ever been invented which will exhibit a gain per stage equal to the amplification factor of the tube while maintaining a flat frequency response characteristic between the cycle and 250 kilocycles, and which will solely employ as circuit components but a single vacuum tube and a single resistor.

Therefore, it is an object of the present invention to provide a new and useful amplifier circuit.

A further object of the present invention is to provide a new and useful amplifier circuit which will exhibit high gain per stage, a uniform frequency response characteristic over a wide range of frequencies, and a minimum number of circuit components.

According to the present invention, the two triode portions of the conventional duo-triode tube, such as a 12AU7 or 12AY7, are series-connected across an anode voltage source. The control electrode of one of the triode portions is directly coupled to the cathode electrode associated therewith so that the duo-triode tube will act as an electronic potentiometer with the anode resistance of one triode portion varying inversely as the anode resistance of the remaining triode portion. By such operation the current through the series-connected triode portions is always constant despite input signal alternations. A resistor in the cathode circuit of the first triode portion serves three functions, namely, a cathode bias resistor, an input impedance across which the signal source is to be coupled, and also a current limiter.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figures 1, 2:
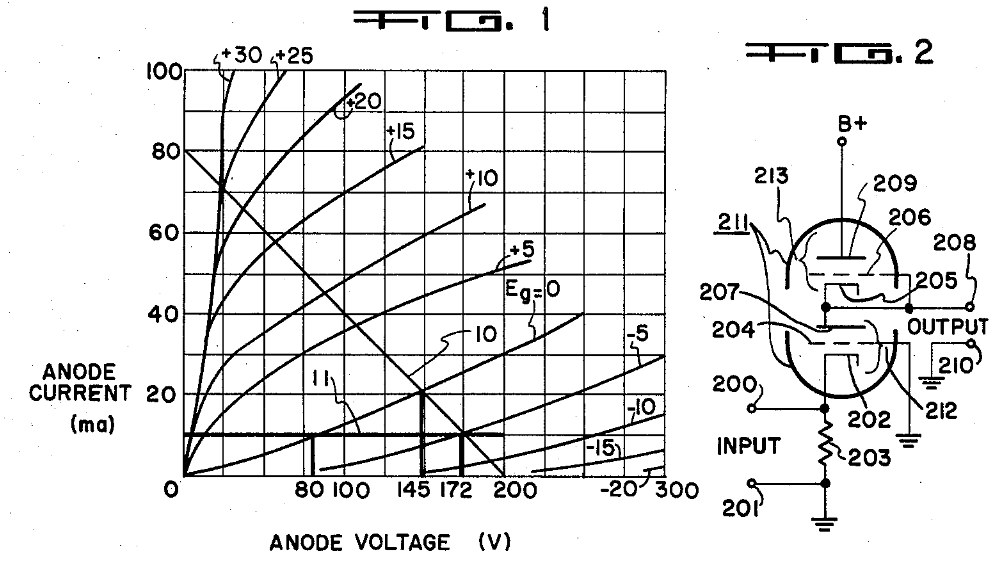
Figure 1 is a graph of the anode characteristic curves of each triode section of a 12AU7 vacuum tube.
Figure 2 is a schematic diagram of a preferred embodiment of an amplifier according to the applicant's invention.

In Figure 1 the characteristic curves of each triode section of a 12AU7 duo-triode vacuum tube are given. With an anode operating voltage of 200 volts and an anode load resistance of 2500 ohms, line 10 will be the load-line determined thereby. Then, for a conventional amplifier, a 5-volt peak-to-peak input voltage on a triode section biased at —2½ volts will produce an anode output voltage swing between 145 volts and 172 volts or a 27 volt swing, with a consequent voltage gain of 5.2. Suppose, however, that the amplifier exhibits a constant current characteristic despite input signal voltage alternations. Then, line 11 would in effect be the load-line utilized, and, for a 5-volt peak-to-peak input signal voltage swing with the triode again biased —2½ volts, the anode voltage peak-to-peak swing would be from 80 volts to 172 volts, or a 92 volt peak-to-peak output voltage swing. In this case the voltage gain would be 92 volts divided by 5 volts or, roughly, 18.4. This is equivalent to 25.3 decibels gain. The phenomenal increase in gain with a "constant current" amplifier is at once noticed. Hence, the problem is to devise an amplifier for which line 11 in Figure 1 will serve as a load-line.

Figure 2 illustrates such an amplifier. Input terminals 200 and 201 are coupled to cathode 202 and ground, respectively. Resistor 203 is coupled between cathode 202 and ground. Control electrode 204 is grounded. Cathode 205 is directly connected to control electrode 206, anode 207, and output terminal 208. Anode 209 is connected to a source of positive voltage (B+). Output terminal 210 is maintained at ground potential.

The circuit of Figure 2 operates as follows. As is shown, vacuum tube 211 consists of two triode portions 212 and 213. As the instantaneous input voltage appearing at input terminal 200 tends to decrease in positive value, or increase negatively, cathode 202 becomes less positive with respect to control electrode 204 and, hence, anode current through triode portion 212 tends to increase and reduce the anode resistance of triode portion 212. But it is noticed that control electrode 206 is directly connected to cathode 205 of triode portion 212. The direct coupling of control electrode 206 to cathode 205 accomplishes a reduction of anode current through triode 213 by virtue of the fact that control electrode 206 tends to collect electrons from the increased current flow and becomes more negative, slightly, than cathode 205, and also control electrode 206 appears as an electrostatic shield to cathode 205 and thus increases the space charge density about cathode 205, tending to cut down anode current through triode portion 211. Thus, vacuum tube 211 may be viewed as an electronic potentiometer in which the anode resistance of triode portion 213 experiences an increase in response to a decrease in anode resistance of triode portion 212. Indeed, experiment has shown that the total "anode resistance" of vacuum tube 211 will always remain constant. Hence, current through vacuum tube 211 will always be of constant magnitude. Cathode resistor 203 serves three functions, namely, a current limiting device, an input impedance, and a bias resistor. The anode current through resistor 203 will always be of constant magnitude. Only the input signal voltage across resistor 203 will vary. All of the advantages of a grounded grid amplifier are employed in the present amplifier, by virtue of control electrode 204 being maintained at ground potential, and yet none of the disadvantages, such as reduced gain, is encountered.

Figures 3, 4, 5:
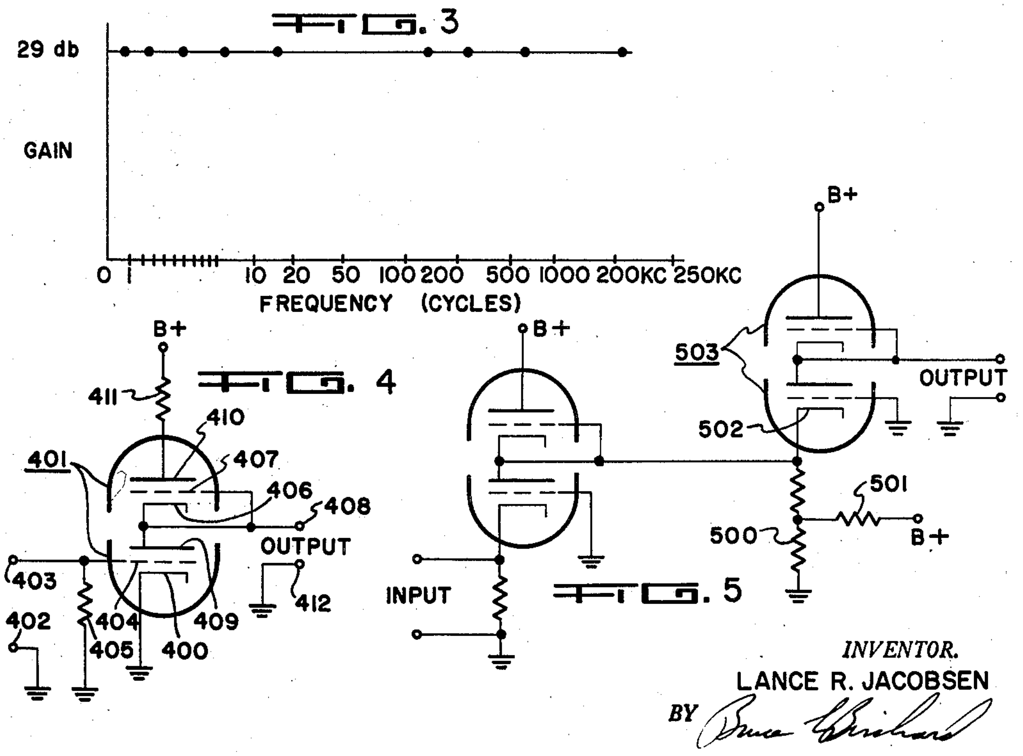
Figure 3 is a graph of the frequency response characteristic of the amplifier shown in Figure 2.
Figure 4 is an additional embodiment of an amplifier according to the present invention.
Figure 5 is a two-stage direct coupled amplifier according to the present invention.

The remarkable frequency response of an amplifier such as that shown in Figure 2 is exhibited graphically in Figure 3. Experiment reveals a frequency response characteristic completely flat between 1 cycle per second and 250 kilocycles per second. This remarkable frequency response is undoubtedly due to the non-existence of reactances in the circuit and also to the grounded grid feature of the amplifier. One limitation, at least with the employment of a 12AU7 or 12AY7 vacuum tube, does exist in the fact that the maximum input signal which can be used will be about 3 or 4 volts.

In Figure 4, cathode 400 of duo-triode vacuum tube 401 is maintained at ground potential, as is also input terminal 402. Input terminal 403 is connected to control electrode 404 and also to ground through resistor 405. Cathode 406 is directly connected to control electrode 407 and also to output terminal 408 and anode 409. Anode 410 is coupled through current limiting resistor 411 to a source of positive voltage (B+). Output terminal 412 is grounded.

The circuit of Figure 4 operates in a manner identical to the circuit of Figure 2 with the exceptions that a current limiting resistor (resistor 411) is placed in the anode circuit of anode 410 and also that the input impedance of the amplifier consists of resistor 405. Current limiting resistor 411 may be deleted if the anode voltage used does not cause the cathode current to exceed rated values. By virtue of the tendency of control electrode 404 to draw current during the positive cycles of the input signal, the input driving voltage must be limited to about 200 millivolts or less. By virtue of the fact that the amplifier shown in Figure 4 is a constant current amplifier, a resistor may also be placed in the cathode circuit of cathode 400 to provide bias and enable higher level signals being employed.

If it is desired to cascade two such stages, it may be accomplished very simply, as can be seen from Figure 5. In addition to the two current limiting resistors required for two separate amplifiers of this type, only two additional resistors, which act as a voltage divider, and no other resistors, condensers or inductors are required. The voltage divider comprising resistors 500 and 501 provides the proper positive bias for cathode 502 of vacuum tube 503. The amplifier of Figure 5 is capable of a voltage gain equal to the mu, or amplification factor, of the vacuum tube, without reference to the frequency of the input signal over a wide range of frequencies.

The importance of this invention is self-evident. Referring again to Figure 2, an amplifier consisting solely of a duo-triode vacuum tube and a single resistor will exhibit the following characteristics: stage gain equal to the amplification factor of the tube, zero phase shift to signals for all frequencies which are unaffected by the anode-cathode capacitance of a given tube, negligible harmonic and inter-modulation distortion, a flat frequency response characteristic from 1 cycle to radio frequencies, and requisite bias being supplied by a single component. As has been shown the amplifier may be coupled directly to succeeding amplifier stages, and such a direct coupled amplifier will be completely stable since the gain of each amplifier remains unchanged with anode voltage variations. Further, decoupling networks or filters are not required between cascaded stages since each stage is a constant current device.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. In combination, an electron discharge device including first and second triode sections each having anode, cathode, and control electrodes, an input resistor having a first end terminal connected to said cathode of said first triode section and a second end terminal maintained at a common reference potential, first and second input terminals coupled across said input resistor, and an output terminal, said anode of said first triode section, said control electrode and cathode of said second triode section, and said output terminal being directly connected solely to each other, said control electrode of said first triode section being maintained at said common reference potential, and said anode of said second triode section being maintained at a positive potential.

2. In combination, an electron discharge device including first and second triode sections each having anode, cathode, and control electrodes, first and second input terminals, an input resistor having a first end terminal connected to said control electrode of said first triode section and a second end terminal maintained at a common reference potential, said first and second input terminals being coupled across said input resistor, said cathode of said first triode section being maintained at said common reference potential, an output terminal said output terminal, said anode of said first triode section, and said control electrode and cathode of said second triode section being directly connected solely to each other, and a second resistor having a first end terminal connected to said anode of said second triode section and a second end terminal maintained at a positive potential.

3. A two-stage amplifier including, in combination, first and second apparatus as defined in claim 1, said output terminal of said first apparatus being directly connected to said cathode of said first triode section of said second amplifier, and an intermediate point of said input resistor which is coupled to said cathode of said first triode section of said second apparatus being maintained at an intermediate positive reference potential.

References Cited in the file of this patent

UNITED STATES PATENTS

| | | |
|---|---|---|
| 2,431,333 | Labin | Nov. 25, 1947 |
| 2,517,863 | Froman | Aug. 8, 1950 |
| 2,592,193 | Saunders | Apr. 8, 1952 |
| 2,658,117 | Sunstein et al. | Nov. 3, 1953 |
| 2,679,556 | Frederick | May 25, 1954 |
| 2,786,901 | Nelson | Mar. 26, 1957 |

FOREIGN PATENTS

| | | |
|---|---|---|
| 688,273 | Great Britain | Mar. 4, 1953 |

OTHER REFERENCES

Publication—General Radio Experimenter, vol. XXVI, No. 5, October 1951, "A New Push-Pull Amplifier Circuit," pp. 1–7.